(12) United States Patent (10) Patent No.: US 6,498,640 B1
Ziger (45) Date of Patent: Dec. 24, 2002

(54) METHOD TO MEASURE ALIGNMENT USING LATENT IMAGE GRATING STRUCTURES

(75) Inventor: David Ziger, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/475,679

(22) Filed: Dec. 30, 1999

(51) Int. Cl.[7] .................. G03B 27/42; G03B 27/52; G03B 27/32
(52) U.S. Cl. .................. 355/53; 355/55; 355/77
(58) Field of Search .................. 355/53, 55, 77; 430/22, 5, 311; 356/399–401

(56) References Cited

U.S. PATENT DOCUMENTS

| | | | |
|---|---|---|---|
| 4,423,127 A | * 12/1983 | Fujimura | 430/22 |
| 4,710,026 A | 12/1987 | Magome et al. | 356/349 |
| 5,798,195 A | * 8/1998 | Nishi | 430/22 |
| 5,910,847 A | 6/1999 | Van der Werf et al. | 356/401 |
| 6,097,473 A | 8/2000 | Ota et al. | 355/53 |

FOREIGN PATENT DOCUMENTS

| | | | |
|---|---|---|---|
| EP | 0 818 814 A2 | 1/1998 | |
| JP | 08045814 | 2/1996 | |
| JP | 11191530 | 7/1999 | |

* cited by examiner

*Primary Examiner*—Russell Adams
*Assistant Examiner*—Hung Henry Nguyen
(74) *Attorney, Agent, or Firm*—Peter Zowliski

(57) ABSTRACT

A method for facilitating alignment measurements in a semiconductor fabrication process that uses a combination of underlying and latent images on a substrate to indicate alignment between a lithographic mask and the substrate. In an example embodiment of the method for measuring alignment, a substrate has a layer of photoresist disposed on it is illuminated through a reticle element resulting in the formation of a first plurality of underlying grating images. The first plurality of images has a repetitive and symmetrical pattern with equal spacing between images. A second plurality of latent grating images is formed in the photoresist having substantially the same pattern of images as the first plurality of images. The second plurality of images is disposed above from the first plurality of images, the first and second plurality of images serving as an indicator of alignment between the mask and the substrate when the combined images forming a repetitive pattern. The system includes an energy source, an optical element and a reticle element for forming the plurality of images on the substrate to aid in alignment.

10 Claims, 5 Drawing Sheets

METHOD TO MEASURE ALIGNMENT USING LATENT IMAGE GRATING STRUCTURES

FIELD OF THE INVENTION

This invention relates to the field of fabricating semiconductor devices and, more particularly, to maintaining accuracy in their fabrication using step and repeat systems for projecting lithographic object images on a wafer substrate to create an array.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

Recent developments in the field of semiconductor wafer fabrication have led to advancements in the size reduction of devices present on die of a semiconductor wafer. Such advancements have lead to increasing density of circuit elements in the die structure. As feature sizes and devices become smaller, there is a need to more precisely align the lithographic masks with the wafer during masking steps, minimizing misalignment between layers.

A typical alignment technique will require the use of alignment targets that are defined on a wafer layer preceding the layer to be deposited. With recent microcircuit devices of semiconductor wafers, a large number of patterns are deposited, for example, to form patterned regions of insulative, conductive and differing conductivity materials. For multiple layers, where successive metallized layers are separated by an insulation layer such as an oxide layer, there is a need to align the topography of each layer over the previous layers.

One way of aligning the plurality of layers to be deposited involves the use of alignment patterns comprising an array of alignment markings that are defined on the wafer on each previous layer. In order to ensure alignment between successive layers, it becomes necessary to replicate the positioning of the alignment markings from one layer to the next. The placement of successive circuit structures, in layers, is dependent on the precise placement of a lithographic mask and the alignment markings on the previous layer.

Another way of aligning the plurality of layers to be deposited involves the use of alignment patterns comprising alignment marks, or markings, that are defined on the wafer on an original base layer, with all subsequent layers being aligned with respect to these alignment marks. For example, fabricating integrated circuit structures on a wafer involves successively forming a series of metallized and insulative layers on the wafer, with the aid of the alignment markings. Typically, an insulative layer separates each pair of metallized layers. The use of alignment markings when depositing the layers ensures alignment between layers, enabling replication of a desired topography from layer to layer.

One such system uses a lithographic process that includes a step-and-repeat aligning system with a reticle to form each individual die on a wafer, successively across the wafer. The wafer is usually secured onto a movable stage and the stage is stepped to a new position each time that the image is projected onto the wafer. The process is repeated until all the desired elements of that particular layer are imprinted on the wafer. In creating various layers, the same step and repeat process is used in order that elements at various levels can be properly aligned for proper interconnection. Consequently, stepper systems are monitored frequently for precise and reproducible stage movement and placement. Alignment corrections need to made regularly on the x and y offsets and on the rotation of the stage, to name a few.

One method to measure alignment correction is to use the "box in a box" approach. In this approach, determining the alignment between successive layers includes printing a first box on one layer into a larger frame of a second box in a lower level or layer. The amount that the inner box is off center relative to the outer frame represents the misalignment from one layer to another. Although the latent image of a box or frame can be used to determine alignment from the top layer to an underlying layer, the contrast is generally poor and/or irreproducible. Attempts have been made to calibrate alignment by processing the dark field image of a latent image superimposed on an alignment artifact. However, the biggest difficulty with this approach has been that the contrast is generally too poor to make this technique sufficiently accurate.

Therefore, there is a need to develop an alignment correction method that is easy to implement and allows for visual verification of proper alignment.

SUMMARY

For many years, there has been a recognized need to be able to measure the alignment of an exposed but undeveloped resist onto a prior layer. With this capability, steppers could virtually calibrate themselves by exposing a small portion of the wafer, measuring the alignment of the latent image and adjusting the pattern placement with this information. Accordingly, a method is described herein that addresses this need by measuring alignment in step and repeat systems. The method includes providing a substrate that has a layer of photoresist disposed on it and then forming a first plurality of underlying grating images in the photoresist. The first plurality of images has a repetitive and symmetrical pattern with equal spacing between images. A second plurality of latent grating images is formed in the photoresist having substantially the same pattern of images as the first plurality of images. The second plurality of images is disposed above and offset from the first plurality of images, the first and second plurality of images serving as an indicator of alignment between the step and repeat system and the substrate when the combined images form a series of equally spaced lines.

According to another aspect of the invention, a method for measuring alignment in a step and repeat system includes providing a substrate with a photoresist thereon and a forming a first plurality of underlying grating lines in the substrate, the lines having a predetermined line pitch. A second plurality of latent grating lines is then formed in the photoresist, having substantially the same pattern of lines as the first plurality of lines, the second plurality of lines being disposed above and offset from the first plurality of lines. The first and second plurality of lines combine to form a regular line-space pitch pattern to indicate that the step and repeat system and the substrate are aligned. In another application, for example, in connection with calibrating an alignment system, the grating lines can be formed in the photoresist rather than the substrate.

In yet another aspect of the invention, a stepper apparatus for projecting images on a semiconductor substrate includes a source of energy for generating an energy beam, a reticle element located in the path of the beam and a lens disposed between the beam and the energy beam. The reticle element has a first region with a pattern for generating a first plurality of underlying images on a semiconductor substrate, the pattern is then transferred into the substrate (e.g., by etching), and a second region with a pattern for generating a second plurality of latent images on the semiconductor substrate. The second plurality of images is disposed above and offset from the first plurality of images after formation. The apparatus also includes a mechanism for inspecting alignment of the first and second plurality of images, alignment being indicated by the formation of a pattern of equally spaced lines when the first and second plurality of images are combined.

In yet another aspect of the invention, a system for measuring alignment in a step and repeat system includes an energy beam generator, a substrate positioner for positioning a photoresist coated substrate under the energy beam and an imaging mechanism adapted to receive the energy beam and form images on the substrate. The imaging system forms a first plurality of underlying grating images in the photoresist, the pattern is then transferred into the substrate (e.g., by etching), the images having a repetitive and symmetrical pattern with equal spacing therebetween, and forms a second plurality of latent images on the semiconductor substrate, the second plurality of images disposed above and offset from the first plurality of images. The system also includes an inspection mechanism for inspecting alignment of the first and second plurality of images, alignment being indicated by the formation of a pattern of equally spaced lines when the images are combined.

The above summary is not intended to provide an overview of all aspects of the present invention. Other aspects of the present invention are exemplified and described in connection with the detailed description.

BRIEF DESCRIPTION OF THE DRAWINGS

Various aspects of, discoveries made in connection with, and advantages of, the present invention will become apparent upon reading the following detailed description of various example embodiments and upon reference to the drawings in which.

Figure 1A:
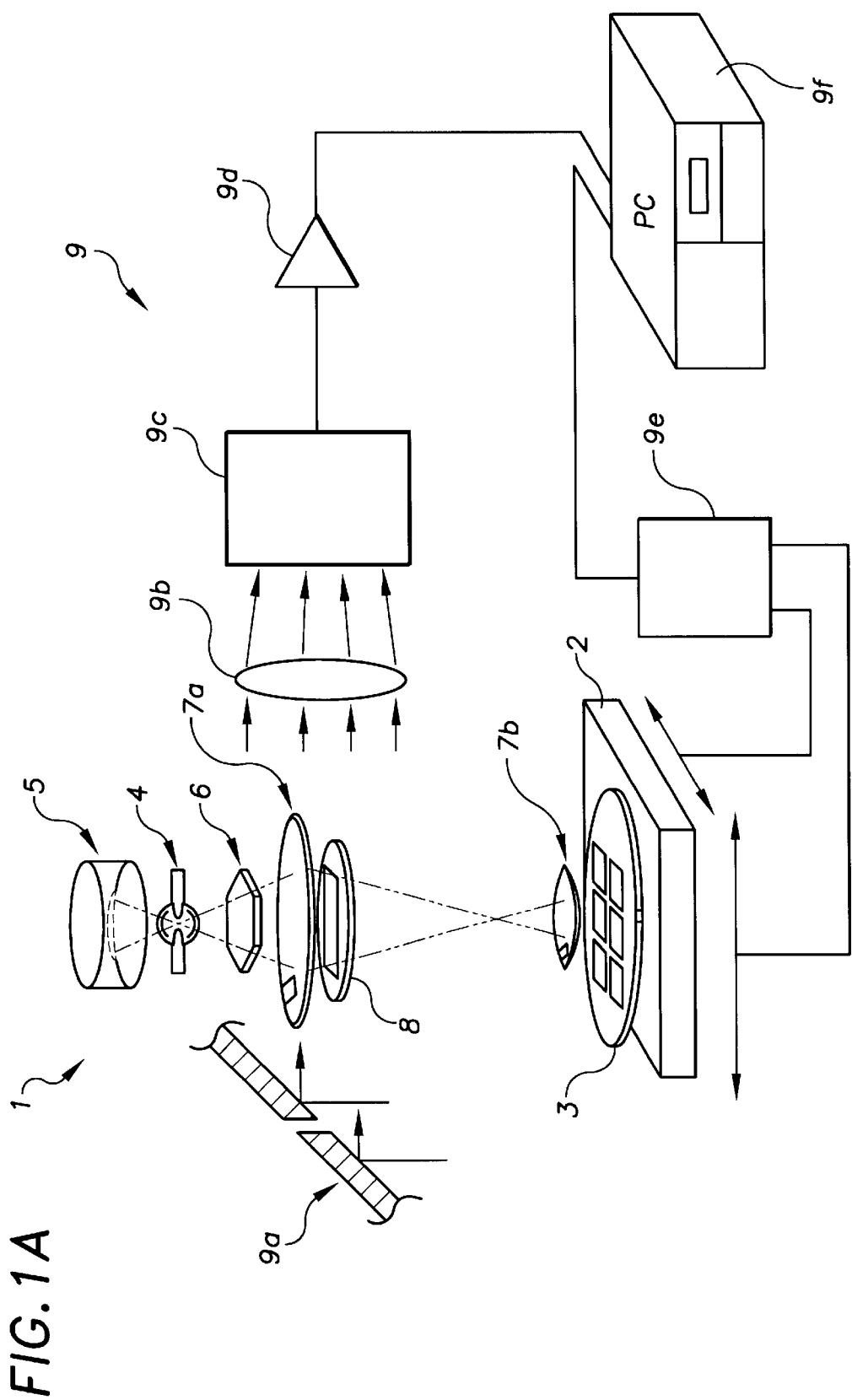
FIG. 1A is a schematic of a step and repeat system with an alignment inspection system incorporated therein, made in accordance with an example embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of semiconductor structures and has been found to be advantageous for use in connection with lithography processes for creating semiconductor elements. While the present invention is not necessarily so limited, an appreciation of various aspects of the invention may be obtained through a discussion of various application examples in such an environment.

In one example application of the present invention, a wafer substrate and a stepper apparatus are aligned visually by forming two images (or grating arrays), a first underlying image and a latent image that is above from the first image. These elements combine to form a series of equally spaced lines. The equally spaced lines indicate that the stepper and substrate are aligned horizontally, vertically and rotationally without the need for metrology equipment. Using a computer arrangement, the stepper can align itself by inspecting the pattern to ensure that the two grating arrays come together to form a series of equally spaced lines. Alignment between the stepper and the substrate is indicated when the inspection process of the latent image and underlying topography that has a regular line-space pitch.

In another example application, a stepper apparatus for projecting images on a semiconductor substrate includes a source of energy for generating an energy beam and optical and reticle elements located in the path of the beam for receiving the energy beam. Two sets of images are formed on the substrate that indicate that the stepper is aligned, when the images are combined and inspected, upon formation of a pattern of equally spaced lines.

Figure 1B:
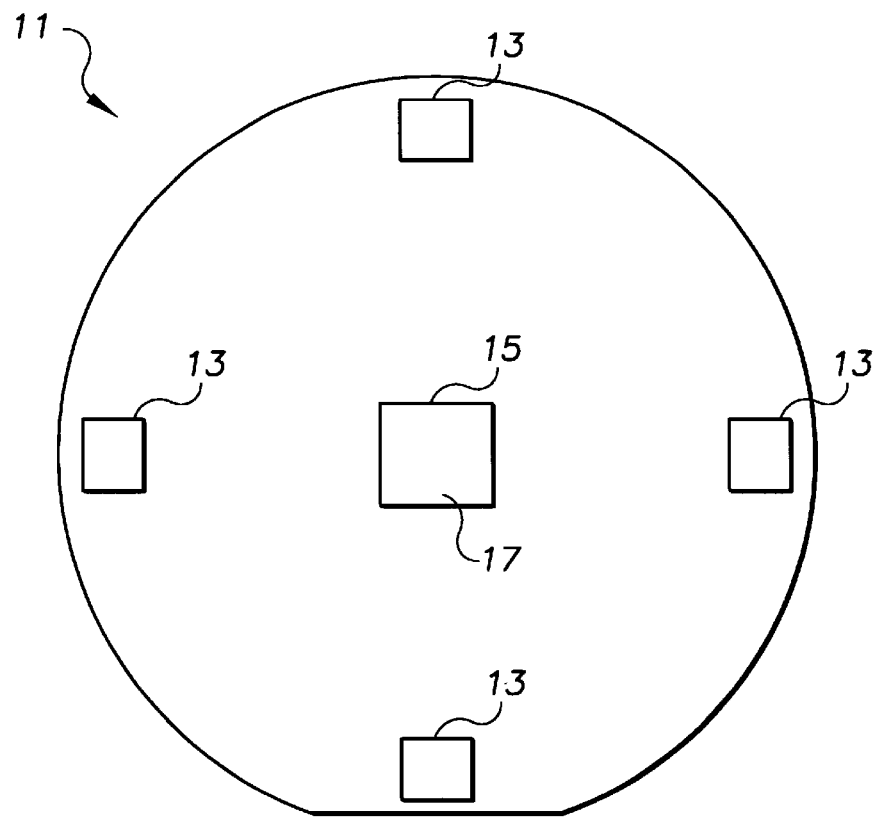
FIG. 1B is a plan view of a wafer substrate that includes a plurality of alignment marks or gratings for measuring alignment of a stepper, made in accordance with an example embodiment of the present invention.
Figure 1C:
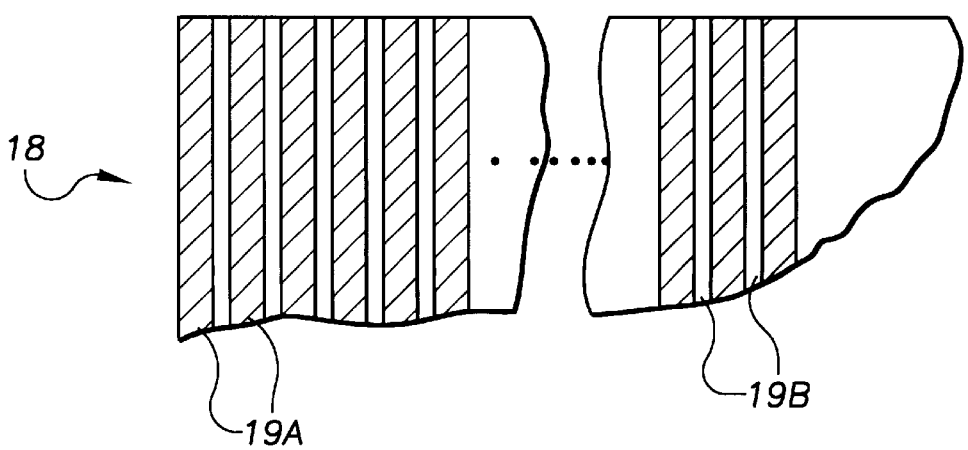
FIG. 1C is a plan view of an example mask used to form a plurality of images on a substrate, the images being used for measuring alignment of a stepper, made in accordance with an example embodiment of the present invention.

Referring now to FIGS. 1A–1C, FIG. 1A illustrates a schematic drawing of a stepper system 1 having a movable stage or platform 2 with a photoresist-coated substrate 3 positioned thereon. An energy source 4 that generates an energy beam, such as high intensity discharge lamp, is positioned above substrate 3 that has its light reflected back down towards substrate 3 by mirror 5. An optional filter 6 is positioned below energy source 4 and above a condenser lens 7a that directs the energy beam through mask or reticle element 8. The energy beam or light that passes through reticle 8 forms an image that is reduced to the final device size when passing through lens 7b before reaching substrate 3. As wafer substrate 3 is printed, the stepper system aligns to the previously printed die. The substrate steps along and the stepper prints one die at a time, each die having an alignment structure (that include latent and underlying images in different layers) to assure alignment throughout the process of building the semiconductor device.

In FIG. 1A, an inspection alignment system 9 is located adjacent stepper system 1 that serves to confirm that the latent and underlying images formed on substrate 3 are aligned, which in turn, indicate that the stepper is aligned with the substrate. A mirror 9a is moved into position, after the alignment images have been formed, to reflect light coming up from the substrate originally generated by energy source 4. The reflected light, which indicates the relative position of the latent and underlying images on the substrate, is directed through lens 9b and into detector 9c. Detector 9c converts the light waves into an electrical signal and transmits the signal to A/D 20 converter 9d. Movement of the substrate under reticle 8 is controlled by a stage position control 9e that controls movement of stage 2 in the x and y directions. A computer arrangement 9f is included in the system that is coupled to stage control 9e and to A/D converter 9d. Computer arrangement 9f conducts data analysis of the light reflected up from the substrate to determine if the alignment in the stepper system is correct. If adjustments are needed, computer 9f can correctly adjust the position of substrate 3 via movement of stage 2. For a more detailed discussion on the components and operation of an example lithographic system for latent image measurements, reference is made to U.S. Pat. No. 5,362,585 to Adams, which is herein incorporated by reference.

FIG. 1B illustrates a semiconductor wafer substrate 11, coated with a photoresist layer 12, that would be placed in a stepper system as shown in FIG. 1A. The coated wafer is exposed to an optional pattern of registration marks 13 to which the stepper system can be aligned. The stepper system can also be aligned with an image pattern 17, within area 15, which is formed according to an example embodiment of the present invention. The images to be formed as part of image pattern 17 will act as a visual aid in aligning the stepper system to the wafer substrate.

Referring to FIG. 1C, the images within area 15 are made with the use of a mask 18 including a series of opaque lines 19a and transparent lines 19b, or spaces, that define the pattern of images 17 to be formed within area 15. A light source illuminates through mask 18 to form the image on the photoresist on the wafer.

Figure 2A:
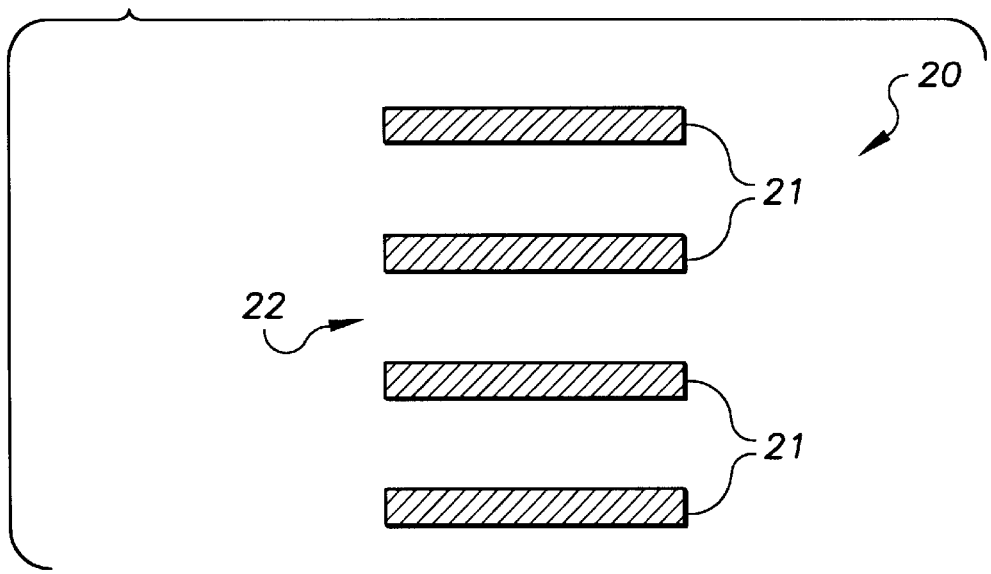
FIG. 2A illustrates a first plurality of underlying alignment grating images, made in accordance with an example embodiment of the present invention.
Figure 2B:
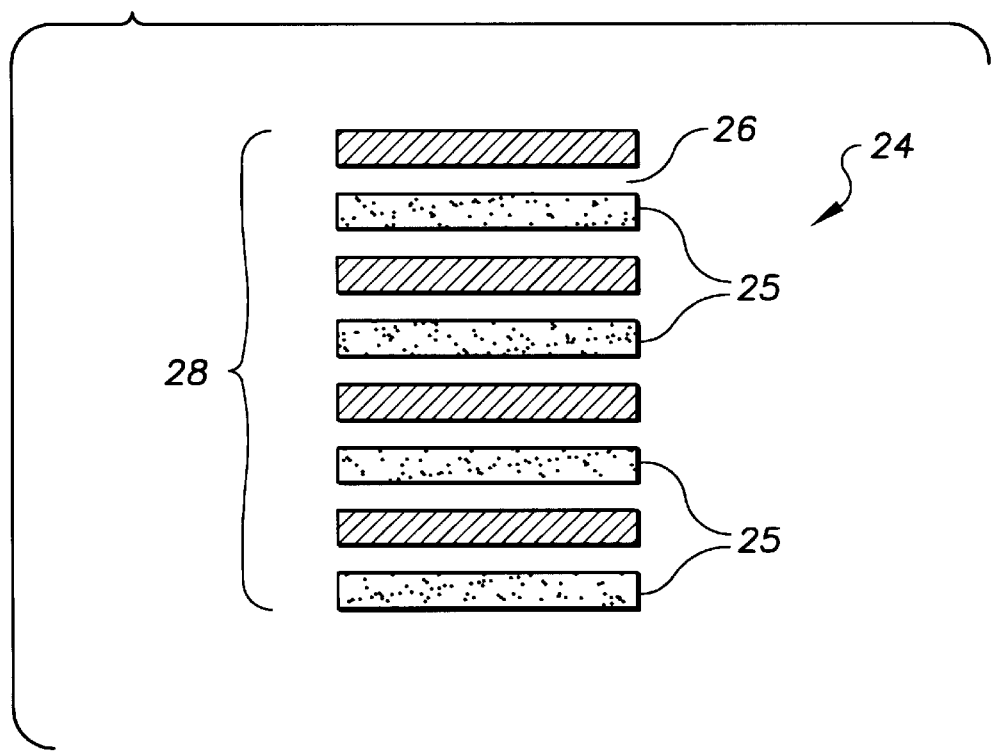
FIG. 2B illustrates a second plurality of latent alignment grating images disposed over and offset from the first plurality of images, made in accordance with an example embodiment of the present invention.

Referring to FIG. 2A, one embodiment of a first plurality of images 20 comprises a grating array of lines 21 having a predetermined line/pitch ratio that provide a predetermined line spacing 22. In this example, the line/pitch ratio is about 1:2. This feature is etched into an underlying layer of the photoresist on wafer 11. Subsequently, a second plurality of images 24, as shown in FIG. 2B in gray shading is exposed on wafer 11. The second plurality of images 24 includes a latent image of grating array or lines 25 with the same 1:2 line/pitch ratio as in array 20. Array 24 is positioned above and offset from array 20, such that the alignment is shifted as shown in FIG. 2B, resulting in an overall structure 28 that has a regular pitch 26. The regular pitch and spacing indicate that the stepper and wafer are aligned. In a variation of this embodiment, the latent image 24 can be offset differently from that shown in FIG. 2B, resulting in an artifact or pattern that will have a more complicated repetitive pitch but is still indicative of proper alignment.

Figure 3A:
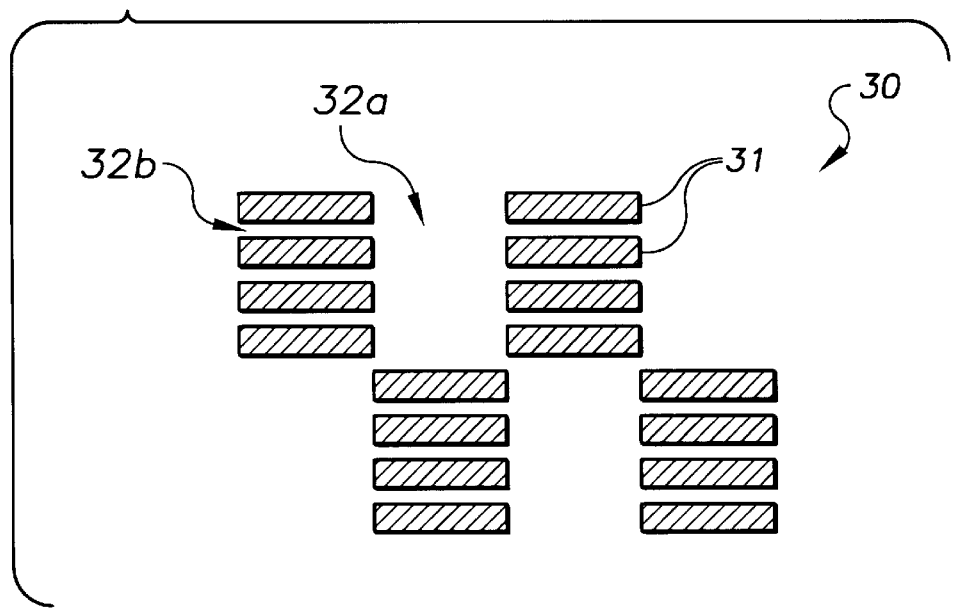
FIG. 3A illustrates a first plurality of alignment lines in the form of a checkerboard pattern, made in accordance with an example embodiment of the present invention.
Figure 3B:
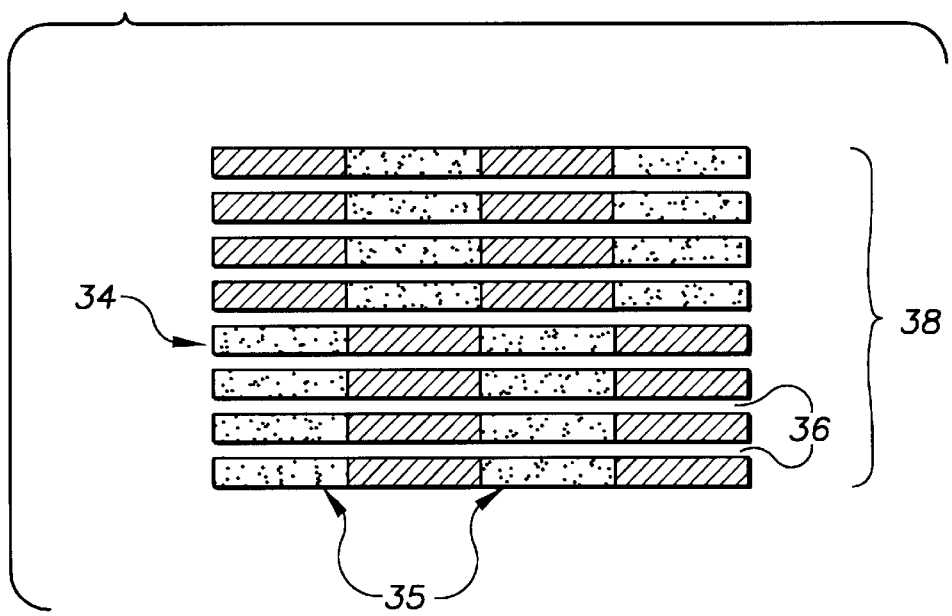
FIG. 3B illustrates a first plurality of alignment lines in the form of a checkerboard pattern, disposed over and offset from the first plurality of lines, made in accordance with an example embodiment of the present invention.

Referring to FIG. 3A, another example embodiment illustrates a checkerboard approach that can be used in connection with measuring alignment. A first plurality of images 30 includes a grating array of lines 31 in a checkerboard pattern has a predetermined pattern spacing 32a and a predetermined line/pitch ratio 32b. In this example, the line/pitch ratio is about 1:1 and the pattern spacing is about 1:1. This feature is etched into an underlying layer of the photoresist on wafer 11. As shown in FIG. 3B, a second plurality of images 34, composed of a latent image of a grating array 35 similar to array 30, is then exposed on wafer 11. Array 34 is positioned above and offset from array 30, such that the alignment is shifted as shown in FIG. 3B, resulting in an overall structure 38 that has a regular pitch 36. The latent image of grating checkerboards is offset by exactly the width of the checkerboard that results in a structure that has a simple linespace pitch. The regular pitch and spacing indicate that the stepper and wafer are aligned. In a variation of this embodiment, underlying image 30 and latent image 34 can be opaque boxes formed in a checkerboard pattern having spacing 32a and a few spacings 32b that generate a pattern with thicker lines but with equal spacings therebetween.

Figure 4A:
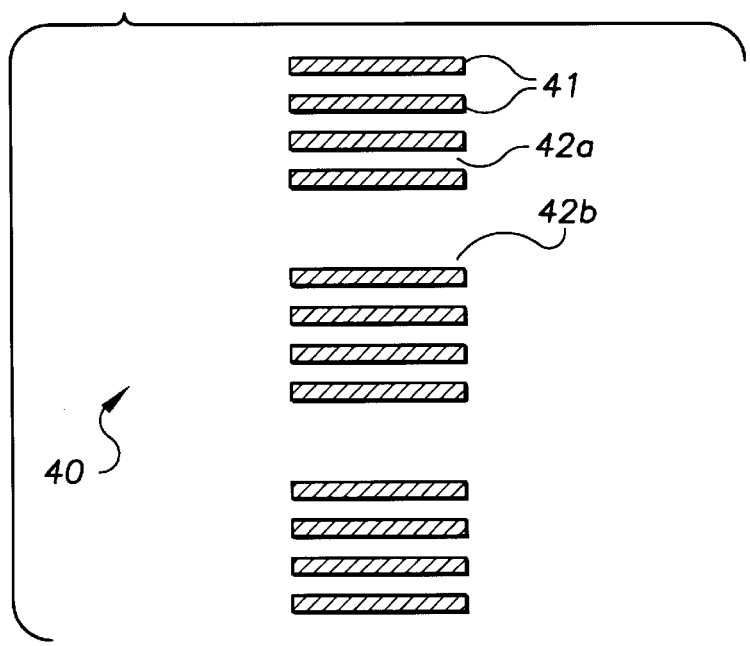
FIG. 4A illustrates a three gratings underlying structure, the structures being at a given pitch, made in accordance with an example embodiment of the present invention.
Figure 4B:
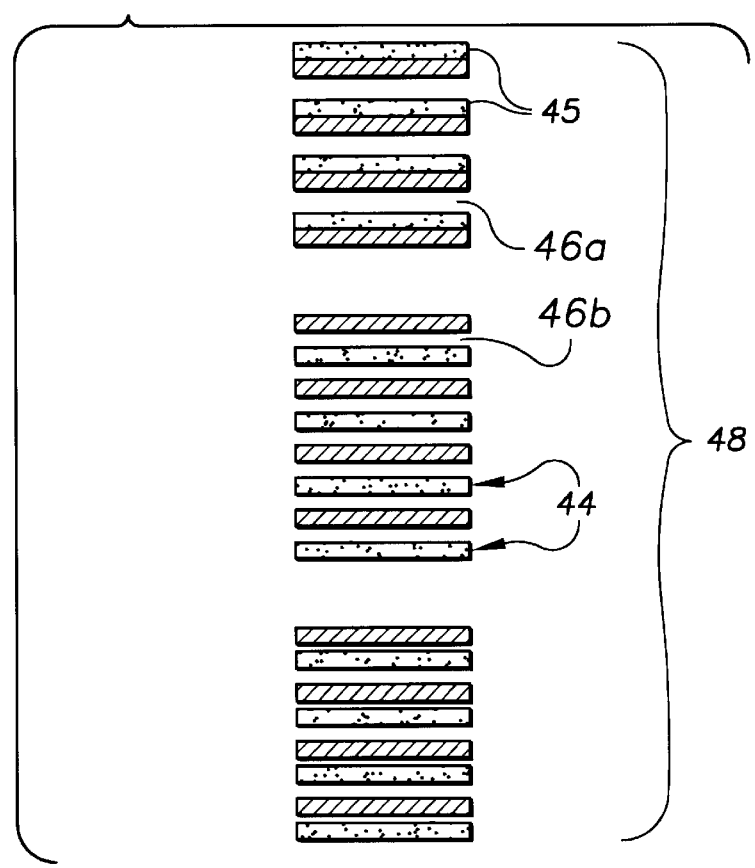
FIG. 4B illustrates a three gratings latent structure, the structures being at a given pitch, made in accordance with an example embodiment of the present invention.

According to another important aspect of the present invention, the degree of misalignment between the stepper system and the substrate can be found by constructing several grating arrays at a given step and repeat distance. FIG. 4A illustrates another embodiment of the present invention that can be used in this regard. A first plurality of images 40 includes a grating array of lines 41 having a predetermined line/pitch ratio that will provide predetermined line spacings 42a and 42b. In this example, the line/pitch ratio is about 1:2 for spacings 42b and 1:1.5 for spacings 42a. This feature is etched into an underlying layer of the photoresist on wafer 11. The latent images is also defined with a multitude of grating arrays but at a slightly different step and repeat distance, as in FIG. 4B. A second plurality of images 44 composed of a latent image of a grating array of lines 45 with the same line/pitch ratios as in array 40 is exposed on wafer 11. Array 44 is positioned above and offset from array 20 such that the alignment is shifted as shown in FIG. 4B, resulting in an overall structure 28 that has a regular pitch 26. As can be seen in FIG. 4B, the latent grating array 44 is stepped at a smaller increment than the prior layer. The middle structure, for instance, has a simple line-space pitch. As in the other embodiments, the regular pitch and spacing indicate that the stepper and wafer are aligned.

In another embodiment, a computer arrangement can be incorporated into the system that is coupled to the stepper so that the stepper can align itself by observing the pattern to ensure that the two gratings come together to form a series of equally spaced lines. The response should be maximized at perfect alignment, which indicates the required stage correction.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A method of providing alignment in a step and repeat system comprising:
   providing a substrate having a photoresist thereon;
   illuminating the substrate through a reticle element;
   forming a first plurality of underlying grating images, the images having a repetitive and symmetrical pattern with equal spacing therebetween;

forming a second plurality of latent grating images in the photoresist, the second plurality of images disposed above from the first plurality of images, the reticle element and the substrate indicating proper alignment when combination of the first and second plurality of images form a series of equally spaced repetitive patterns; and determining the position of at least one of the underlying and latent grading lines to provide alignment.

2. The method of claim 1, wherein determining the position of at least one of the underlying and latent grating lines includes the step of inspecting the substrate to determine the position of the underlying and latent grating lines.

3. The method of claim 2, wherein the grating images are formed of line and space features.

4. The method of claim 2, further including the step of adjusting the position of the substrate with respect to the reticle element where the latent and underlying grating images do not initially form a pattern of equally spaced lines.

5. A method of measuring alignment in a step and repeat system comprising:

providing a substrate having a photoresist thereon;

illuminating the substrate through a reticle element, forming a first plurality of underlying grating lines, the lines having a predetermined line pitch forming a second plurality of latent grating lines in the photoresist, the second plurality of lines disposed above from the first plurality of lines, the reticle element and the substrate indicating proper alignment when the combination of the first and second plurality of lines form a regular line-space pitch pattern; and determining the position of at least one of the underlying and latent grating lines.

6. The method of claim 5, wherein determining the position of at least one of the underlying and latent grating lines includes the step of inspecting the substrate to determine the position of the underlying and latent grating lines.

7. The method of claim 6, further including the step of adjusting the position of the substrate with respect to the reticle element where the latent and underlying grating images do not initially form a pattern of equally spaced lines.

8. The method of claim 5, wherein the line/pitch ratio of the combination of the second plurality of lines over and offset from the first plurality of lines is about 1:1.

9. The method of claim 5, wherein the first and second plurality of lines are composed of a grating array of checkerboards.

10. The method of claim 5, wherein the first and second plurality of images are each composed of a grating array of checkerboards and the combination of the images form a series of equally spaced lines.

* * * * *